United States Patent
Kazemi-Nia et al.

(10) Patent No.: US 7,373,090 B2
(45) Date of Patent: May 13, 2008

(54) MODULATOR DRIVER CIRCUIT WITH SELECTABLE ON-CHIP TERMINATION

(75) Inventors: Mehdi Kazemi-Nia, Los Angeles, CA (US); Ivan I. Chen, La Puente, CA (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 10/814,911

(22) Filed: Mar. 26, 2004

(65) Prior Publication Data
US 2005/0213993 A1    Sep. 29, 2005

(51) Int. Cl.
*H04B 10/04* (2006.01)
(52) U.S. Cl. .................. 398/198; 359/245; 359/248
(58) Field of Classification Search ........... 398/198; 327/108; 359/245, 248, 237, 254, 276, 278, 359/279; 385/2
See application file for complete search history.

(56) References Cited

U.S. PATENT DOCUMENTS

| | | | | |
|---|---|---|---|---|
| 4,109,214 A * | 8/1978 | Main | .................. | 330/254 |
| 5,224,111 A * | 6/1993 | Stilwell et al. | ................. | 398/5 |
| 5,546,218 A * | 8/1996 | Komatsubara et al. | ....... | 359/237 |
| 5,550,513 A * | 8/1996 | Wong | .......................... | 330/286 |
| 5,585,763 A * | 12/1996 | Navabi et al. | .............. | 330/255 |
| 5,706,117 A * | 1/1998 | Imai et al. | .................. | 398/197 |
| 5,900,745 A * | 5/1999 | Takahashi | .................... | 326/64 |
| 5,930,022 A | 7/1999 | Okuma | | |
| 6,256,127 B1* | 7/2001 | Taylor | ............................ | 398/9 |
| 6,606,177 B1* | 8/2003 | Chujo et al. | ................ | 398/183 |
| 6,707,589 B2* | 3/2004 | Bostak et al. | ............... | 359/245 |
| 6,836,185 B1* | 12/2004 | Pobanz | ........................ | 330/260 |
| 7,099,596 B2* | 8/2006 | Watanabe et al. | ............ | 398/183 |
| 7,164,692 B2* | 1/2007 | Cox et al. | ................... | 370/466 |
| 2003/0006842 A1* | 1/2003 | Turudic et al. | ............. | 330/253 |
| 2003/0011865 A1* | 1/2003 | Kimura | ...................... | 359/237 |
| 2003/0180054 A1* | 9/2003 | Watanabe et al. | ........... | 398/182 |
| 2003/0234969 A1* | 12/2003 | Bostak et al. | ............... | 359/240 |
| 2004/0075474 A1* | 4/2004 | Umeda et al. | .............. | 327/112 |
| 2004/0189388 A1* | 9/2004 | Nguyen et al. | .............. | 330/254 |
| 2005/0099748 A1* | 5/2005 | Aemireddy | ..................... | 361/82 |
| 2005/0103769 A1* | 5/2005 | Marquis | ...................... | 219/204 |
| 2006/0109723 A1* | 5/2006 | Martin | ......................... | 365/198 |

* cited by examiner

*Primary Examiner*—Kenneth Vanderpuye
*Assistant Examiner*—Thi Q. Le
(74) *Attorney, Agent, or Firm*—Kacvinsky LLC (57) ABSTRACT

A method and apparatus to accommodate differing output loads without sacrificing impedance matching in an optical modulator driver.

14 Claims, 8 Drawing Sheets

50 Ohm Termination Case

Fig 4A

25 Ohm Termination Case

Fig 4B

MODULATOR DRIVER CIRCUIT WITH SELECTABLE ON-CHIP TERMINATION

BACKGROUND

A high speed optical communication system may use various methods to modulate an optical signal with data information for propagation along an optical transmission medium such as optical fiber. Optical modulators may use a driver circuit to provide an electrical signal corresponding to the data to be modulated. Impedance matching, where the maximum transfer of power from the driver circuit to the modulator, however, takes place when the source and load impedances (in this case driver and modulator impedances) are complex conjugates. Typically, drivers on separate chips have been employed to drive different output loads. These driver circuits, however, must support various output load values without sacrificing associated impedance matching. Consequently, there may be a need for improvements in impedance matching for optical modulator driver circuits while obviating the need for separate modulator chips and chipsets to drive various output loads.

BRIEF DESCRIPTION OF THE DRAWINGS

The subject matter regarded as embodiments is particularly pointed out and distinctly claimed in the concluding portion of the specification. The embodiments, however, both as to organization and method of operation, together with objects, features, and advantages thereof, may best be understood by reference to the following detailed description when read with the accompanying drawings in which:

DETAILED DESCRIPTION

The embodiments relate to a modulator driver circuit having selectable on-chip back termination to accommodate various load values without sacrificing impedance matching between the driver and the modulation technique employed. Standard impedance values are associated with various components and devices included in optical transmission equipment. Typical optical modulator drivers have impedance values that match the impedance value of the modulator.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Numerous specific details may be set forth herein to provide a thorough understanding of the embodiments. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein may be representative and do not necessarily limit the scope of the embodiment.

Figure 1:
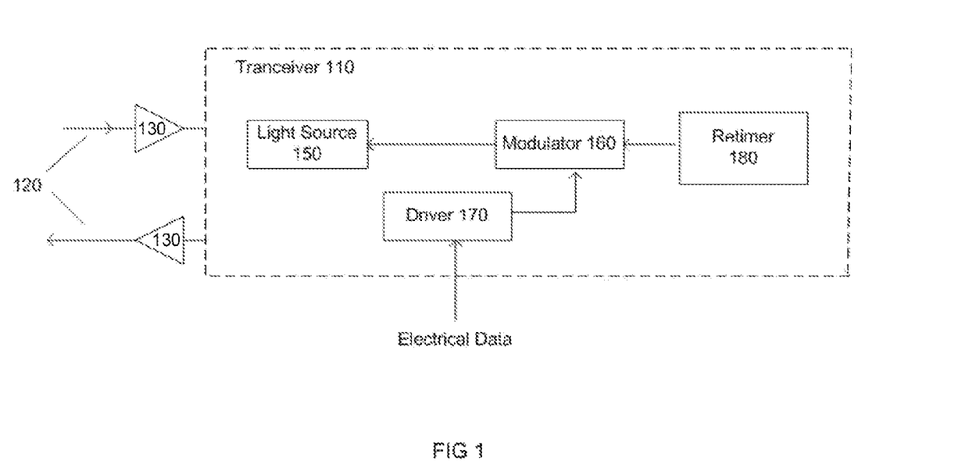
FIG. 1 is a block diagram of a transceiver 110 utilized in high speed optical communication systems suitable for practicing one embodiment.

Referring now in detail to the drawings wherein like parts are designated by like reference numerals throughout, FIG. 1 is a block diagram of transceiver 110 utilized in high speed optical communication systems suitable for practicing one embodiment. Transceiver module 110 is operatively responsive to transmission medium 120 configured to allow the propagation of a plurality of information signals. The expression "information signals," as used herein, refers to an optical or electrical signal which has been coded with information. An optical communication is configured with transceivers at both ends of transmission medium 120 to accommodate bidirectional communication within a single line card. Additional amplifiers 130 may also be disposed along transmission medium 120 depending on the desired transmission distances and associated span losses in order to provide an information signal having a power level sufficient for detection and processing by the receive functionality (not shown) of transceiver 110.

The information signals transmitted by transceiver 110 may be modulated using various techniques including return to zero (RZ) where the signal returns to a logic 0 before the next successive date bit and/or non-return to zero (NRZ) format where the signal does not return to a logic 0 before the next successive data bit. Transceiver 110 may comprise a light source 150, such as a semiconductor laser, modulator 160, modulator driver 170 and re-timer circuit or encoder circuit 180 to transmit optical signals. Re-timer circuit 180 receives information signals in electrical form and supplies these signals to modulator 160 which provides current variations proportional to the received information signals to modulator 160. Light source 150 generates optical signals proportional to the received current levels for propagation over transmission medium 120.

Light source 150 may be directly modulated obviating the need for modulator 160. In a directly modulated laser (DML) configuration, a minimum current signal, also known as a threshold current, is applied to the laser causing the laser to operate in the lasing mode. This threshold current is temperature dependant and may vary over the operating range of the laser. In order to modulate the laser, the current signal is varied between a point near the threshold current corresponding to an "off" state and above the threshold current to correspond to an "on" state consistent with the data to be modulated. This technique is used so that the laser remains in the lasing mode which avoids going from a true off state, below the lasing threshold, to the lasing threshold.

In high gigabit data transmission, however, it is more difficult to switch the laser between these two levels. Therefore, external modulation may be more desirable. In external modulation, a constant light source or laser is used and the data is modulated externally using modulator 160. In this manner, laser 150 supplies a carrier wave at a constant output power and is coupled to a discrete optical modulator. A radio frequency (RF) signal supplied to the modulator from driver 170 encodes the data onto the constant light source. In this manner, laser 150 remains in its lasing mode and the signal is modulated externally from the light source.

In one embodiment, there are two types of external modulators, namely a lithium niobate ($LiNbO_3$) Mach-Zender interferometer and an electro-absorption (EA) modulator. EA modulators make use of either Pockels effect or the quantum confinement Stark effect of a quantum well where the refractive index of the semiconductor material is changed upon application of an applied voltage. EA modulators are fabricated on a single chip with a distributed feedback (DFB) laser and may be driven at relatively low voltage levels. Similarly, in a Mach-Zender modulator an RF signal changes the refractive index around a pair of waveguides. The modulator has two waveguides and the incoming light is supplied to each waveguide where a voltage may be applied to one or both of the waveguides. This electric field changes the refractive index so that the light emerging from one waveguide will be out of phase with the light output from the other waveguide. When the light is recombined, it interferes destructively, effectively switching the light off. Without an applied field the light is in phase and remains "on" thereby producing a corresponding modulated signal.

In either modulation technique, modulator driver 170 provides an RF signal corresponding to the data to be modulated. As described briefly above, devices are designed for operating efficiencies such that their input and output impedances match. For example, modulator 160 may have an input impedance of 25Ω or 50Ω. Likewise, driver 170 must have a matching impedance to avoid costly customized system or component designs. Modulator driver 170 also includes a preamplifier that converts low-level electrical data to signals having sufficient power levels to drive optical modulator 160 without adding signal distortion.

Figure 2A:
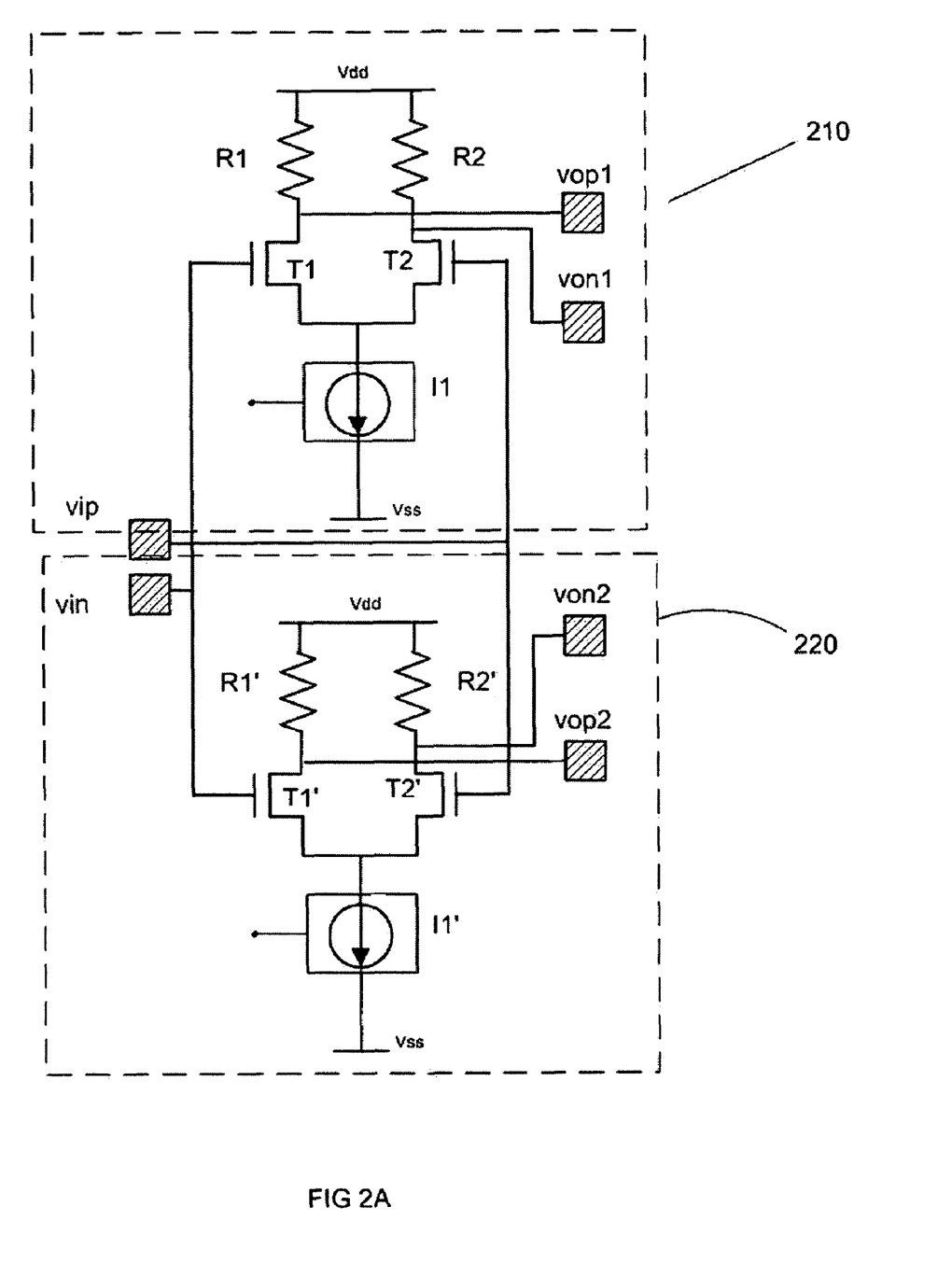
FIGS. 2A-2C schematically illustrate various driver circuits in accordance with one embodiment.
Figure 2B:
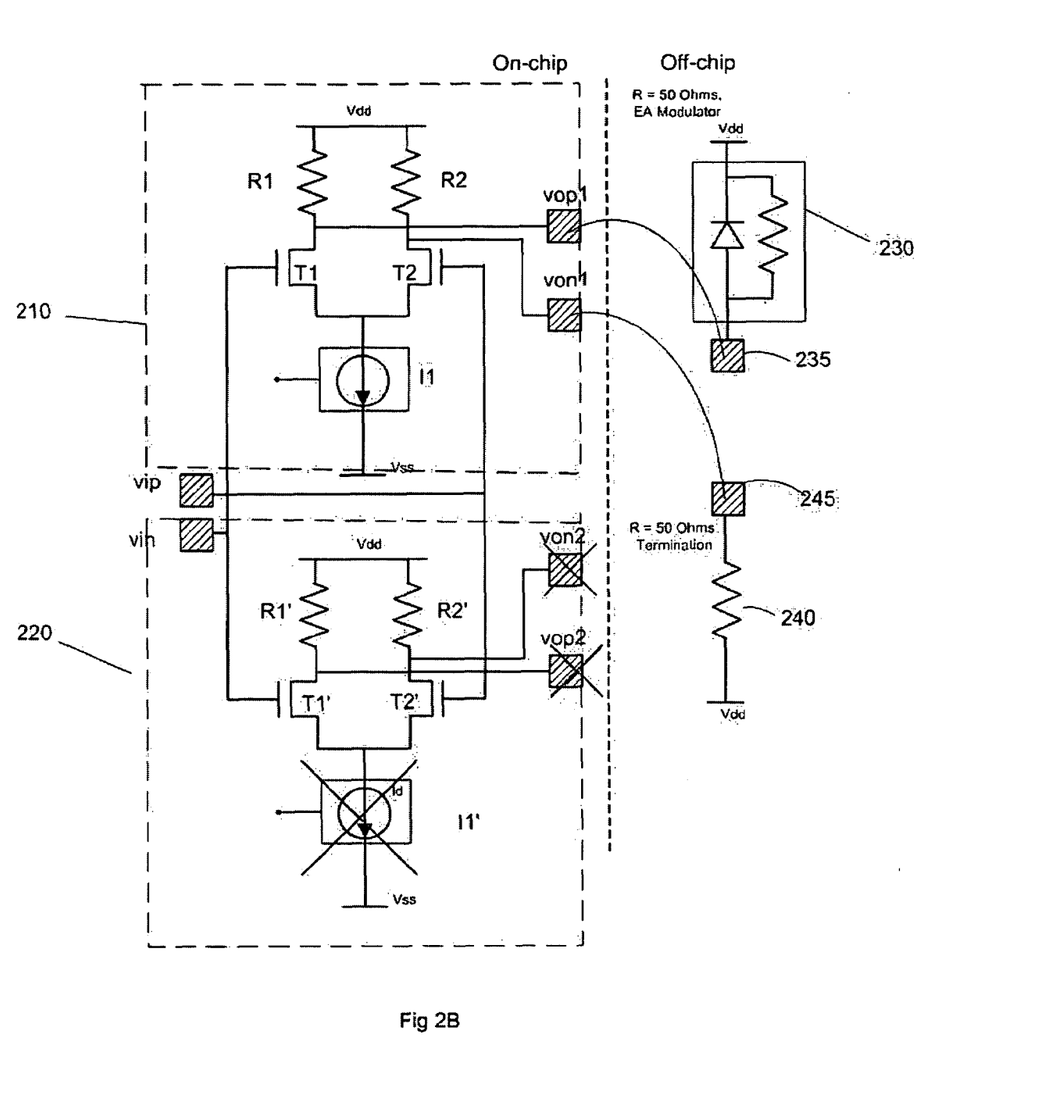
Figure 2C:
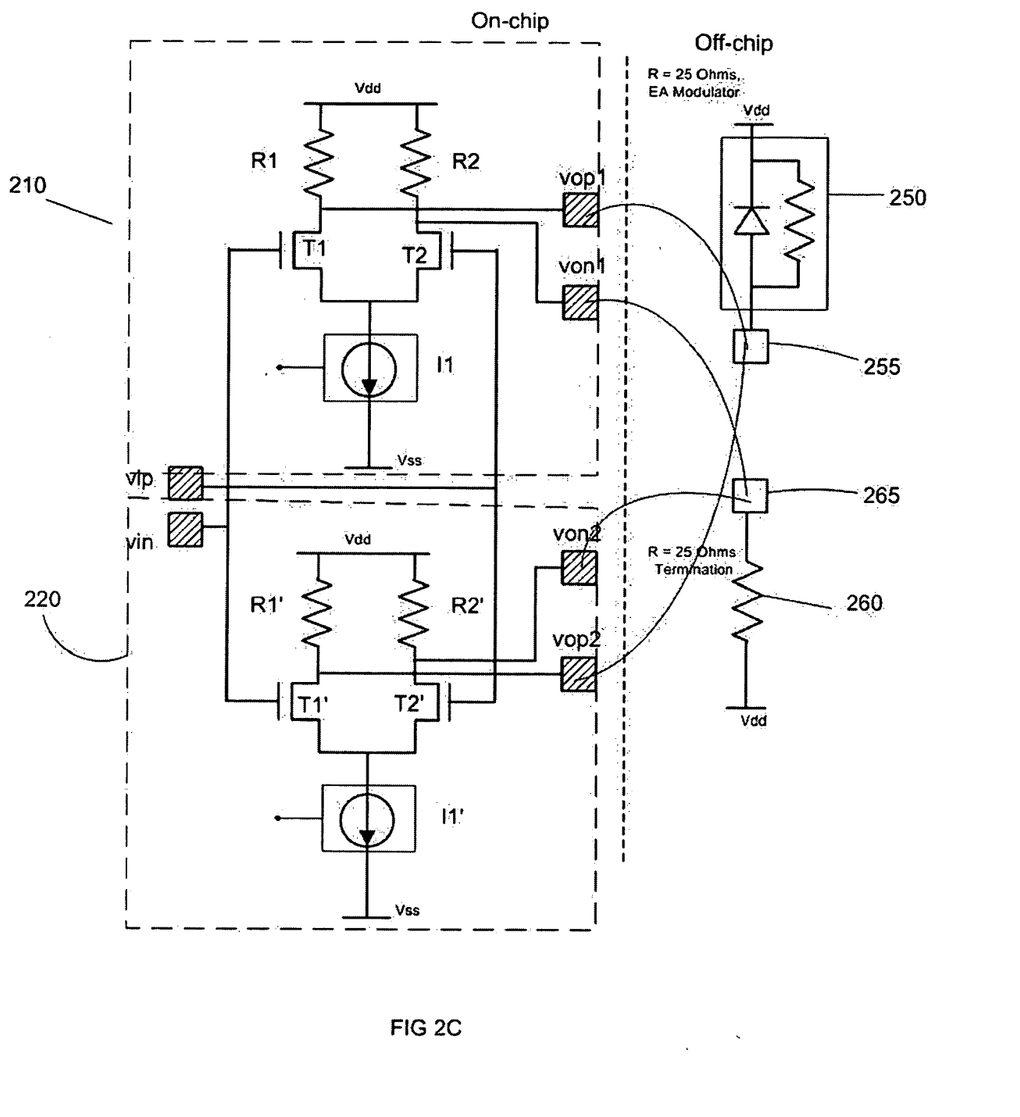

FIGS. 2A-2C schematically illustrate various driver circuits in accordance with an embodiment with separate output pads thereby alleviating the need for separate ships to drive different output loads.

FIG. 2A illustrates a schematic diagram of driver circuit 170 configured to accommodate either a 25Ω or 50Ω output load while maintaining acceptable impedance matching. Driver 170 is configured as two essentially identical driver circuits 210 and 220 with separate back termination or output pads Vop1, Von1 and Von2 and Vop2 which allow the drivers to be connected or disconnected depending on the desired output load. The circuits are essentially identical in terms of parasitic capacitances and resistances, share power supply voltage Vdd, and designed to drive a 50Ω load independently. Output pads Vop1 and Von1 are connected or wire bonded to circuit 210 and output pads Von2 and Vop2 are connected to circuit 220. Driver circuit 210 includes differential transistor pair T1 and T2 whose source terminals are connected to current source $I_1$. The drain terminals of transistors T1 and T2 are connected to output termination resistors R1 (50Ω) and R2 (50Ω) respectively. Input signals Vip and Vin are applied to the gate terminals of T1 and T2 to turn the transistors on and off and likewise the constant current source I1 of circuit 210. Driver circuit 220 is a mirror image of circuit 210, but for the individual output pads, and includes differential transistor pair T1' and T2' whose source terminals are connected to current source $I_1'$. The drain terminals of transistors T1' and T2' are connected to output termination resistors R1' (50Ω) and R2' (50Ω) respectively. Input signals Vip and Vin are applied to the gate terminals of T1' and T2'. Input signals Vip and Vin are applied to the gate terminals of T1' and T2' to turn the transistors on and off and likewise the constant current source I1' of circuit 220.

FIG. 2B illustrates the disconnect configuration of the two driver circuits 210 and 220 to drive a 50Ω load. Circuit 230 represents an off chip EA modulator with R=50Ω and an off-chip input pad 235. Resistor 240 (50Ω) and input pad 245 represents an off-chip equivalent 50Ω termination resistance. Output pad Vop1 is connected to input pad 235 and output pad Von1 is connected to input pad 245. Output pads Von2 and Vop2 are left open and current source $I_1'$ of driver circuit 220 is disabled thereby saving half the circuit power. In this manner a selectable on-chip back termination to accommodate a 50Ω load value is achieved essentially using the dual driver circuit 210.

FIG. 2C illustrates the connection configuration of the two driver circuits 210 and 220 to provide a 25Ω termination. Similar to circuit 230, circuit 250 of FIG. 2C represents an off chip EA modulator with R=50Ω and an input pad 255. Resistor 260 and input pad 265 represent an equivalent termination resistance (25Ω). Input pad 255 is connected to output pads Vop1 and Vop2. Input pad 265 is connected to output pads Von1 and Von2. Since the termination resistors are in parallel a 25Ω driver is provided using the dual driver circuits 210 and 220.

Figure 3A:
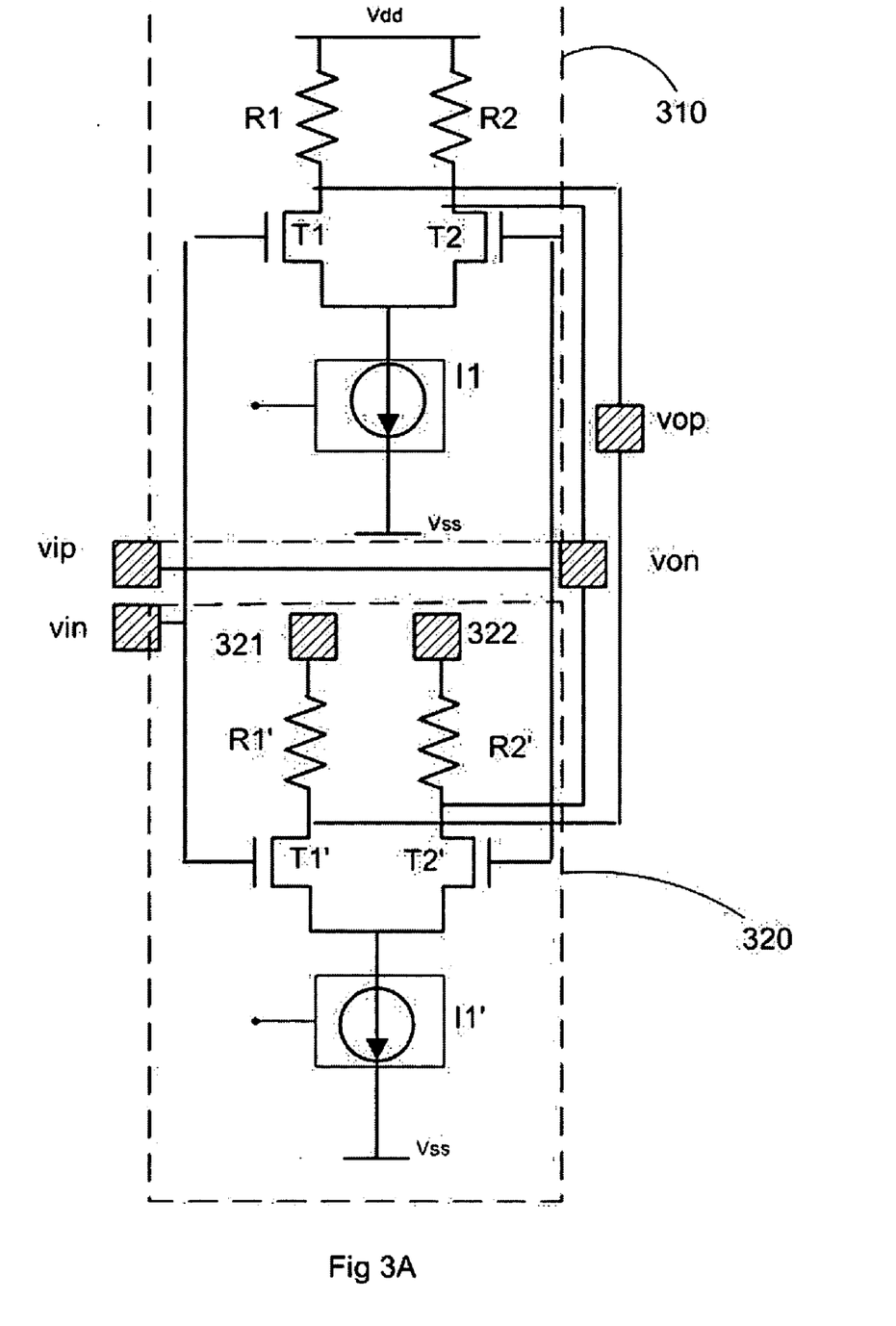
FIGS. 3A-3C schematically illustrate various driver circuits in accordance with one embodiment.
Figure 3B:
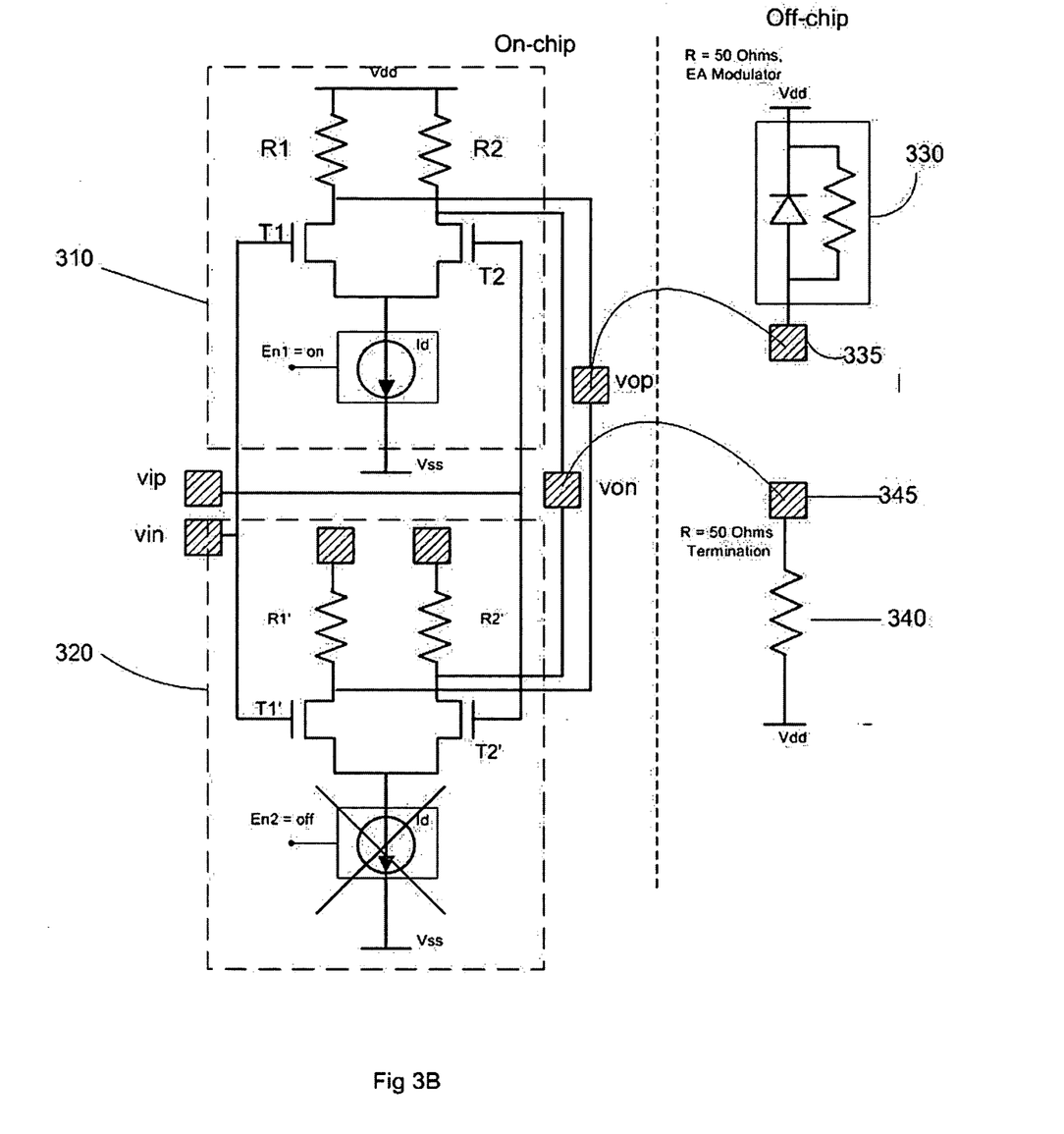
Figure 3C:
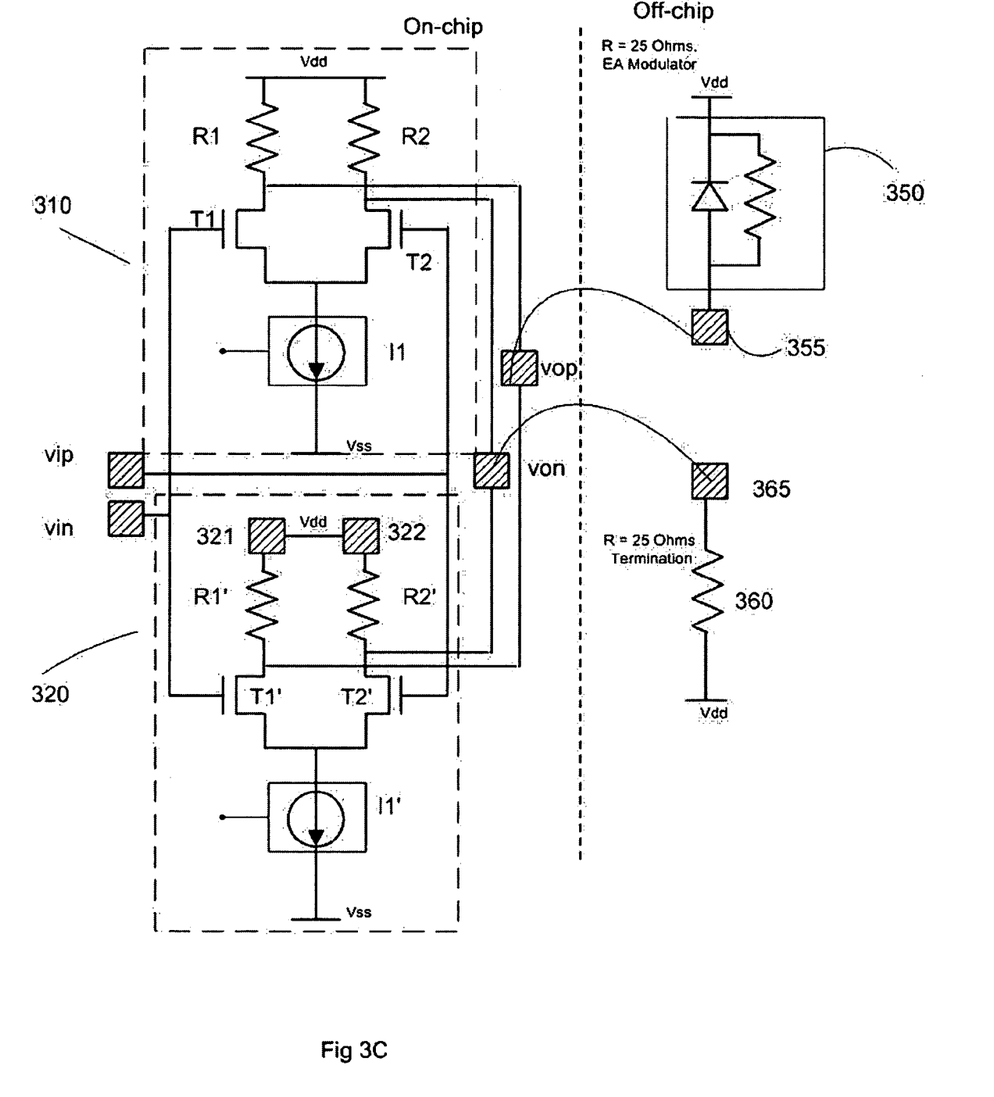

FIGS. 3A-3C schematically illustrate various driver circuits in accordance with an embodiment with common on-chip back termination or output pads and separate power supply terminals.

FIG. 3A illustrates a schematic diagram of driver circuit 170 configured to accommodate either a 25Ω or 50Ω output load while maintaining acceptable impedance matching. Similar to FIGS. 2A-2C, driver 170 is configured as two essentially identical driver circuits 310 and 320 with common on-chip back termination or output pads Vop and Von and separate power supply terminals Vdd for circuit 310 and power supply terminals 321 and 322 for circuit 320. By utilizing separate power supply connections, driver circuit 320 may be connected or disconnected depending on the desired output load. Other than the Vdd connections, circuits 310 and 320 are essentially identical in terms of parasitic capacitances and resistances and designed to drive a 50Ω load independently. Driver circuit 310 includes differential transistor pair T1 and T2 whose source terminals are connected to current source 11. The drain terminals of transistors T1 and T2 are connected to output termination resistors R1 (50Ω) and R2 (50Ω) respectively. Input signals Vip and Vin are applied to the gate terminals of T1 and T2. Driver circuit 320 is a mirror image of circuit 310, but for the separate power supply connections 321 and 322, and includes differential transistor pair T1' and T2' whose source terminals are connected to current source $I_1'$. The drain terminals of transistors T1' and T2' are connected to output termination resistors R1' (50Ω) and R2' (50Ω) respectively. Input signals Vip and Vin are applied to the gate terminals of T1' and T2'. In this manner, output pads Vop and Von are shared on-chip by both driver circuits 310 and 320.

FIG. 3B illustrates the power supply disconnect configuration of driver circuit 320 to drive a 50Ω off-chip load. Circuit 330 represents an off chip EA modulator with R=50Ω and an off-chip input pad 335. Resistor 340 (50Ω) and input pad 345 represents an off-chip equivalent 50Ω termination resistance. Shared output pad Vop is connected to input pad 335 and output pad Von is connected to input pad 345. The power to circuit 320 is turned off, thereby disabling current source $I_1'$ of circuit 320. In this manner, a selectable on-chip back termination is used to provide a 50Ω termination configuration essentially utilizing driver circuit 310.

FIG. 3C illustrates the connection configuration of the two driver circuits 310 and 320 to provide a 25Ω termination. Similar to circuit 330, circuit 350 of FIG. 3C represents an off chip EA modulator with R=25Ω and an input pad 355. Resistor 360 and input pad 365 represents an equivalent termination resistance (25Ω). Input pad 355 is connected to output pad Vop and input pad 365 is connected to output pads Von. Power supply pads 321 and 322 are each connected to Vdd providing power to circuit 320 and driving current source $I_1'$ of circuit 320. Similar to FIG. 2C, the termination resistors of FIG. 3C are now in parallel essentially producing a 25Ω driver using the dual driver circuits 310 and 320.

Figure 4A:
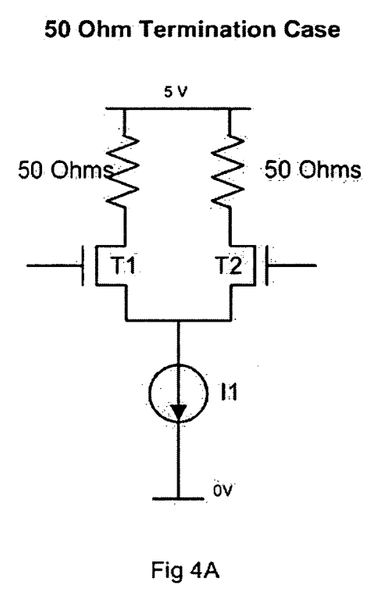
FIG. 4A illustrates a circuit for a 50Ω load dual driver circuit in accordance with one embodiment.
Figure 4B:
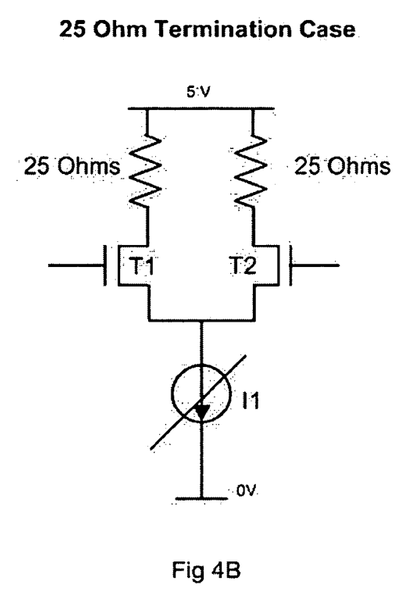
FIG. 4B illustrates a circuit for a 25Ω load dual driver circuit in accordance with one embodiment.

FIGS. 4A and 4b illustrate an equivalent circuit for the 50Ω and 25Ω dual driver approach. In particular, FIG. 4A is an equivalent circuit representing the 50Ω load illustrated in the dual driver circuit configuration of FIGS. 2B and 3B. Similarly, FIG. 4B is an equivalent circuit representing the 25Ω load illustrated in the dual driver circuit configuration of FIGS. 2C and 3C.

An embodiment provides a driver that accommodates different output loads while maintaining impedance matching and avoiding additional chip counts associated with individual drivers. By changing the connections between on-chip and off-chip output pads, as well as on chip power supply terminals, a circuit designer can manipulate the output loads without sacrificing impedance matching.

While certain features of the embodiments have been illustrated as described herein, many modifications, substitutions, changes and equivalents will now occur to those skilled in the art. It is, therefore, to be understood that the appended claims are intended to cover all such modifications and changes as fall within the true spirit of the embodiments.

The invention claimed is:

1. A driver circuit, comprising:
a first driver circuit having a first output terminal operatively responsive to an output load resistance corresponding to a modulator circuit and a second output terminal operatively responsive to a termination resistance, said first driver circuit having a constant current source configured to supply a current signal in response to an input signal applied to said first driver circuit; and
a second driver circuit having a constant current source, said second driver circuit operatively responsive to said first driver circuit by a first and second input terminals;
wherein said second driver circuit further comprising first and second output terminals, said output terminals being unconnected to said modulator circuit and said termination resistor disabling said constant current source associated with said second driver circuit.

2. The driver circuit of claim 1, wherein said constant current source of said second driver circuit is disabled.

3. The driver circuit of claim 1, wherein said first driver circuit further comprises a first transistor, said first transistor having a source terminal operatively responsive to said constant current source, a drain terminal operatively responsive to a first resistor, and a gate terminal configured to receive said input signal.

4. The driver circuit of claim 3, wherein said input signal is a first input signal, said first driver circuit further comprising a second transistor having a source terminal operatively responsive to said constant current source and said source terminal of said first transistor, a drain terminal operatively responsive to a second resistor and a gate terminal configured to receive a second input signal.

5. The driver circuit of claim 4, wherein said first output terminal is connected, at a first end, to said drain terminal of said first transistor and to an input of said modulator circuit at a second end, and said second output terminal is connected, at a first end, to said drain terminal of said second transistor and to said termination resistance at a second end.

6. The driver circuit of claim 1, wherein said second driver circuit further comprising a first transistor, said first transistor having a source terminal operatively responsive to said constant current source, a drain terminal operatively responsive to a first resistor, and a gate terminal configured to receive said input signal.

7. The driver circuit of claim 6, wherein said input signal is a first input signal, and said second driver circuit further comprising a second transistor having a source terminal operatively responsive to said constant current source of said second driver circuit and said source terminal of said first transistor, a drain terminal operatively responsive to a second resistor and a gate terminal configured to receive a second input signal.

8. The driver circuit of claim 7, wherein said second driver circuit further comprising first and second output terminals, said first output terminal connected at a first end to said drain terminal of said second transistor and to said termination resistance at a second end, said second output terminal connected at a first end to said drain terminal of said first transistor and to an input of said modulator circuit.

9. The driver circuit of claim 1, wherein said first driver circuit further comprising first and second power supply terminals, said second driver circuit further comprising first and second power supply terminals, said first driver circuit further operatively responsive to said second driver circuit by said first and second output terminals.

10. The driver circuit of claim 9, wherein a voltage signal is supplied to said first driver circuit via said first and second power supply terminals but not supplied to said first and second power supply terminals of said second driver circuit disabling said constant current source associated with said second driver circuit.

11. The driver circuit of claim 1, wherein said first and second driver circuits are mirror images of each other.

12. An optical communication system, comprising:
a transmission medium configured to allow propagation of optical signals;
at least one optical amplifier disposed along said transmission path for amplifying said optical signals; and
a transceiver operatively responsive to said transmission medium, said transceiver comprising a light source, a modulator for modulating said information signals onto light signals generated by said light source and a modulator driver for supplying electrical signals representing said information signals to said modulator, said modulator driver comprising a first driver circuit having a first output terminal operatively responsive to an output load resistance corresponding to said modulator circuit and a second output terminal operatively responsive to a termination resistance, said first driver circuit having a constant current source configured to supply a current signal in response to an input signal applied to said first driver circuit and a second driver circuit having a constant current source, said second driver circuit operatively responsive to said first driver circuit by a first and second input terminals;
wherein said second driver circuit further comprising first and second output terminals, said output terminals being unconnected to said modulator circuit and said termination resistor disabling said constant current source associated with said second driver circuit.

13. The system of claim 12, wherein said first driver circuit further comprising first and second power supply terminals, said second driver circuit further comprising first and second power supply terminals, said first driver circuit further operatively responsive to said second driver circuit by said first and second output terminals.

14. The system of claim 13, wherein power is supplied to said first driver circuit via said first and second power supply terminals but not supplied to said first and second power supply terminals of said second driver circuit disabling said constant current source associated with said second driver circuit.

* * * * *

UNITED STATES PATENT AND TRADEMARK OFFICE
CERTIFICATE OF CORRECTION

PATENT NO. : 7,373,090 B2
APPLICATION NO. : 10/814911
DATED : May 13, 2008
INVENTOR(S) : Kazemi-Nia

It is certified that error appears in the above-identified patent and that said Letters Patent is hereby corrected as shown below:

Title page.
The title page showing an illustrative figure should be deleted and substitute therefor the attached Title Page.

Drawings
On Sheet 1 of 8, in Fig. 1 (Referral Numeral 110), line 1, delete "Tranceiver" and insert -- Transceiver --, therefor.

Signed and Sealed this

Sixteenth Day of September, 2008

JON W. DUDAS
*Director of the United States Patent and Trademark Office*

(12) United States Patent
Kazemi-Nia et al.

(10) Patent No.: US 7,373,090 B2
(45) Date of Patent: May 13, 2008

(54) MODULATOR DRIVER CIRCUIT WITH SELECTABLE ON-CHIP TERMINATION

(75) Inventors: Mehdi Kazemi-Nia, Los Angeles, CA (US); Ivan I. Chen, La Puente, CA (US)

(73) Assignee: Intel Corporation, Santa Clara, CA (US)

(*) Notice: Subject to any disclaimer, the term of this patent is extended or adjusted under 35 U.S.C. 154(b) by 677 days.

(21) Appl. No.: 10/814,911

(22) Filed: Mar. 26, 2004

(65) Prior Publication Data
US 2005/0213993 A1   Sep. 29, 2005

(51) Int. Cl.
*H04B 10/04* (2006.01)
(52) U.S. Cl. .......... 398/198; 359/245; 359/248
(58) Field of Classification Search ........ 398/198; 327/108; 359/245, 248, 237, 254, 276, 278, 359/279; 385/2
See application file for complete search history.

(56) References Cited

U.S. PATENT DOCUMENTS

| | | | |
|---|---|---|---|
| 4,109,214 A * | 8/1978 | Main | 330/254 |
| 5,224,111 A * | 6/1993 | Stilwell et al. | 398/5 |
| 5,546,218 A * | 8/1996 | Komatsubara et al. | 359/237 |
| 5,550,513 A * | 8/1996 | Wong | 330/286 |
| 5,585,763 A * | 12/1996 | Navabi et al. | 330/255 |
| 5,706,117 A * | 1/1998 | Imai et al. | 398/197 |
| 5,900,745 A * | 5/1999 | Takahashi | 326/64 |
| 5,930,022 A | 7/1999 | Okuma | |
| 6,256,127 B1 * | 7/2001 | Taylor | 398/9 |
| 6,606,177 B1 * | 8/2003 | Chujo et al. | 398/183 |
| 6,707,589 B2 * | 3/2004 | Bostak et al. | 359/245 |
| 6,836,185 B1 * | 12/2004 | Pobanz | 330/260 |
| 7,099,596 B2 * | 8/2006 | Watanabe et al. | 398/183 |
| 7,164,692 B2 * | 1/2007 | Cox et al. | 370/466 |
| 2003/0006842 A1 * | 1/2003 | Turudic et al. | 330/253 |
| 2003/0011865 A1 * | 1/2003 | Kimura | 359/237 |
| 2003/0180054 A1 * | 9/2003 | Watanabe et al. | 398/182 |
| 2003/0234969 A1 * | 12/2003 | Bostak et al. | 359/240 |
| 2004/0075474 A1 * | 4/2004 | Umeda et al. | 327/112 |
| 2004/0189388 A1 * | 9/2004 | Nguyen et al. | 330/254 |
| 2005/0099748 A1 * | 5/2005 | Aemireddy | 361/82 |
| 2005/0103769 A1 * | 5/2005 | Marquis | 219/204 |
| 2006/0109723 A1 * | 5/2006 | Martin | 365/198 |

* cited by examiner

*Primary Examiner*—Kenneth Vanderpuye
*Assistant Examiner*—Thi Q. Le
(74) *Attorney, Agent, or Firm*—Kacvinsky LLC (57) ABSTRACT

A method and apparatus to accommodate differing output loads without sacrificing impedance matching in an optical modulator driver.

14 Claims, 8 Drawing Sheets